United States Patent
Suto et al.

(10) Patent No.: US 11,683,944 B2
(45) Date of Patent: Jun. 20, 2023

(54) LAMINATE, ORGANIC THIN FILM SOLAR CELL, METHOD FOR MANUFACTURING LAMINATE, AND METHOD FOR MANUFACTURING ORGANIC THIN FILM SOLAR CELL

(71) Applicants: JFE Steel Corporation, Tokyo (JP); NATIONAL UNIVERSITY CORPORATION HOKKAIDO UNIVERSITY, Sapporo (JP)

(72) Inventors: Mikito Suto, Tokyo (JP); Hiroyuki Masuoka, Tokyo (JP); Akira Matsuzaki, Tokyo (JP); Hiroki Habazaki, Sapporo (JP); Hikaru Kobayashi, Sapporo (JP)

(73) Assignees: JFE Steel Corporation, Tokyo (JP); National University Corporation Hokkaido University, Hokkaido (JP)

( * ) Notice: Subject to any disclaimer, the term of this patent is extended or adjusted under 35 U.S.C. 154(b) by 0 days.

(21) Appl. No.: 17/760,631

(22) PCT Filed: Sep. 28, 2020

(86) PCT No.: PCT/JP2020/036512
§ 371 (c)(1),
(2) Date: Mar. 15, 2022

(87) PCT Pub. No.: WO2021/070647
PCT Pub. Date: Apr. 15, 2021

(65) Prior Publication Data
US 2022/0336763 A1      Oct. 20, 2022

(30) Foreign Application Priority Data
Oct. 8, 2019     (JP) .............................. JP2019-185052

(51) Int. Cl.
*H01L 31/00*     (2006.01)
*H10K 30/82*     (2023.01)
(Continued)

(52) U.S. Cl.
CPC .............. *H10K 30/82* (2023.02); *H10K 30/30* (2023.02); *H10K 30/40* (2023.02); *H10K 71/60* (2023.02); *H10K 2102/101* (2023.02)

(58) Field of Classification Search
CPC ........ H10K 30/82; H10K 30/30; H10K 30/40; H10K 71/60; H10K 2102/101;
(Continued)

(56) References Cited

U.S. PATENT DOCUMENTS

2008/0110497 A1   5/2008   Inoue et al.
2012/0207947 A1   8/2012   Hadipour
2017/0125171 A1   5/2017   Lee et al.

FOREIGN PATENT DOCUMENTS

CN    107369766 A    11/2017
EP    3896753 A1    10/2021
(Continued)

OTHER PUBLICATIONS

Apostolopoulou et al., "Enhanced performance of mesostructured perovskite solar cells in ambient conditions with a composite TiO2—In2O3 electron transport layer," Solar Energy Materials and Solar Cells, vol. 166, Jul. 2017, pp. 100-107 (Year: 2017).*
(Continued)

*Primary Examiner* — Angelo Trivisonno
(74) *Attorney, Agent, or Firm* — RatnerPrestia

(57) ABSTRACT

A laminate which allows to obtain an organic thin-film solar cell having excellent output characteristics and transparency is provided. The laminate as above has a titanium oxide layer that is disposed on the member serving as a light-transmissive electrode layer and serves as an electron transport layer.
(Continued)

The titanium oxide layer has a thickness of not less than 1.0 nm and not more than 200.0 nm. The titanium oxide layer contains indium oxide and metallic indium, InOx/Ti is not less than 0.50 and not more than 20.00 in atomic ratio, and InM/Ti is less than 0.100 in atomic ratio, where an elemental titanium content is represented by Ti, an indium oxide content is represented by InOx, and a metallic indium content is represented by InM.

11 Claims, 1 Drawing Sheet

(51) Int. Cl.
*H10K 30/30* (2023.01)
*H10K 30/40* (2023.01)
*H10K 71/60* (2023.01)
*H10K 102/10* (2023.01)

(58) Field of Classification Search
CPC .......... H10K 30/211; H10K 2102/103; H10K 30/15; Y02E 10/549
See application file for complete search history.

(56) References Cited

FOREIGN PATENT DOCUMENTS

| | | |
|---|---|---|
| JP | 2005243379 A | 9/2005 |
| JP | 2009146981 A | 7/2009 |
| JP | 2012211068 A | 11/2012 |
| JP | 2013089807 A | 5/2013 |
| JP | 2015002001 A | 1/2015 |
| JP | 2019145621 A | 8/2019 |
| JP | 6741187 B1 | 8/2020 |
| TW | 200642960 A | 12/2006 |
| TW | 201530797 A | 8/2015 |

OTHER PUBLICATIONS

Wenjiao et al., "Electrochemical impedance spectroscopy investigation on indium tin oxide films under cathodic polarization in NaOH solution", Thin Solid Films, vol. 520, Issue 23, Sep. 30, 2012, pp. 6916-6692 (Year: 2012).*
International Search Report and Written Opinion for International Application No. PCT/JP2020/036512, dated Dec. 8, 2020, 7 pages.
Peng et al., "Efficient Indium-Doped TiOx Electron Transport Layers for High-Performance Perovskite Solar Cells and Perovskite-Silicon Tandems", Adv. Energy Mater. 2016, 1601768, 11 pages.
Taiwanese Office Action with Concise Statement of Relevance for Taiwanese Application No. 109134671, dated Apr. 21, 2021, 4 pages.
Apostolopoulou, A. et al., "Enhanced Performance of Mesostructured Perovskite Solar Cells in Ambient Conditions with a Composite $TiO_2$—$In_2O_3$ Electron Transport Layer", Mar. 23, 2017, pp. 100-107, vol. 166, Solar Energy Materials & Solar Cells, Elsevier Science Publishers, Amsterdam, NL, XP029977092.
Extended European Search Report for European Application No. 20 873 810.4, dated Sep. 29, 2022, 7 pages.

* cited by examiner

LAMINATE, ORGANIC THIN FILM SOLAR CELL, METHOD FOR MANUFACTURING LAMINATE, AND METHOD FOR MANUFACTURING ORGANIC THIN FILM SOLAR CELL

CROSS REFERENCE TO RELATED APPLICATIONS

This is the U.S. National Phase application of PCT/JP2020/036512, filed Sep. 28, 2020, which claims priority to Japanese Patent Application No. 2019-185052, filed Oct. 8, 2019, the disclosures of these applications being incorporated herein by reference in their entireties for all purposes.

The present invention relates to a laminate, an organic thin-film solar cell, a method for producing a laminate, and a method for producing an organic thin-film solar cell.

BACKGROUND OF THE INVENTION

Conventionally, there has been known an organic thin-film solar cell of "normal type" that includes a light-transmissive electrode layer, a hole transport layer, an organic semiconductor layer, an electron transport layer and a collector electrode layer in this order.

In addition, in recent years, there has been proposed an organic thin-film solar cell of "inverted type" that includes a light-transmissive electrode layer, an electron transport layer, an organic semiconductor layer, a hole transport layer and a collector electrode layer in this order for the sake of improvement in durability and other properties (see Patent Literature 1).

PATENT LITERATURES

Patent Literature 1: JP 2009-146981 A

SUMMARY OF THE INVENTION

As described above, an organic thin-film solar cell includes, for instance, a light-transmissive electrode layer, an electron transport layer, an organic semiconductor layer, a hole transport layer and a collector electrode layer in this order.

Such an organic thin-film solar cell is required to demonstrate excellent output characteristics when used in an actual living environment.

In Patent Literature 1, a titanium oxide layer to serve as an electron transport layer is formed using a sol-gel process. A titanium oxide layer formed using a sol-gel process becomes amorphous and includes oxygen deficiency, whereby the electron transfer resistance is perhaps reduced.

However, the present inventors found, through a study, that an organic thin-film solar cell in which an electron transfer layer was formed using a sol-gel process had insufficient output characteristics in some cases.

Moreover, in recent years, it has been proposed to replace glass windows used in, for example, houses and vehicles with an organic thin-film solar cell having good transparency. In this case, a titanium oxide layer serving as an electron transport layer is required to have excellent transparency.

Accordingly, an object according to aspects of the present invention is to provide a laminate that serves as a light-transmissive electrode layer and an electron transport layer of an inverted type organic thin-film solar cell including the light-transmissive electrode layer, the electron transport layer, an organic semiconductor layer, a hole transport layer and a collector electrode layer in this order, and that enables to obtain an organic thin-film solar cell having excellent output characteristics and transparency.

Another object according to aspects of the present invention is to provide a new method for producing the laminate.

The present inventors found, through an earnest study, that employing the configuration described below enables the achievement of the above-mentioned objects, and aspects of the invention have been completed.

Specifically, aspects of the present invention include the following [1] to [7].

[1] A laminate serving as a light-transmissive electrode layer and an electron transport layer of an organic thin-film solar cell including the light-transmissive electrode layer, the electron transport layer, an organic semiconductor layer, a hole transport layer and a collector electrode layer in this order, the laminate comprising:
a member that serves as the light-transmissive electrode layer; and
a titanium oxide layer that is disposed on the member serving as the light-transmissive electrode layer and serves as the electron transport layer,
wherein the titanium oxide layer has a thickness of not less than 1.0 nm and not more than 200.0 nm, and
wherein the titanium oxide layer contains indium oxide and metallic indium, InOx/Ti is not less than 0.50 and not more than 20.00 in atomic ratio, and InM/Ti is less than 0.100 in atomic ratio, where an elemental titanium content is represented by Ti, an indium oxide content is represented by InOx, and a metallic indium content is represented by InM.

[2] An organic thin-film solar cell including a light-transmissive electrode layer, an electron transport layer, an organic semiconductor layer, a hole transport layer and a collector electrode layer in this order and using the laminate according to [1].

[3] A laminate producing method for producing the laminate according to [1], the method comprising:
subjecting the member that serves as the light-transmissive electrode layer to cathode polarization and then to anode polarization in a treatment solution containing a Ti component to thereby form the titanium oxide layer on the member that serves as the light-transmissive electrode layer.

[4] The laminate producing method according to [3], wherein a Ti content of the treatment solution is not less than 0.004 mol/L and not more than 1.300 mol/L.

[5] The laminate producing method according to [3] or [4], wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

[6] The laminate producing method according to any one of [3] to [5], wherein current is applied at a current density of not less than 0.01 A/dm² and not more than 5.00 A/dm² with the member that serves as the light-transmissive electrode layer being used as a cathode, and then current is applied at a current density of not less than 0.01 A/dm² and not more than 5.00 A/dm² with the member that serves as the light-transmissive electrode layer being used as an anode.

[7] An organic thin-film solar cell producing method for producing an organic thin-film solar cell including a light-transmissive electrode layer, an electron transport layer, an organic semiconductor layer, a hole transport layer and a collector electrode layer in this order by using the laminate according to [1].

Aspects of the present invention make it possible to provide a laminate that serves as a light-transmissive electrode layer and an electron transport layer of an organic thin-film solar cell including the light-transmissive electrode layer, the electron transport layer, an organic semiconductor layer, a hole transport layer and a collector electrode layer in this order, and that enables to obtain an organic thin-film solar cell having excellent output characteristics and transparency.

Aspects of the present invention also make it possible to provide a new method for producing the laminate.

DETAILED DESCRIPTION OF EMBODIMENTS OF THE INVENTION

[Organic Thin-Film Solar Cell]

First, an organic thin-film solar cell 1 is described with reference to FIG. 1.

Figure 1:
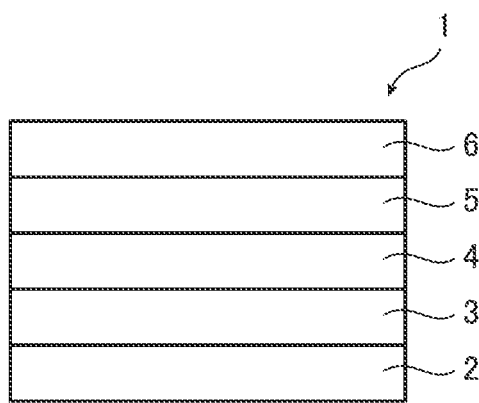
FIG. 1 is a cross-sectional view schematically showing an organic thin-film solar cell.

FIG. 1 is a cross-sectional view schematically showing the organic thin-film solar cell 1. The organic thin-film solar cell 1 includes, for instance, a light-transmissive electrode layer 2, an electron transport layer 3, an organic semiconductor layer 4, a hole transport layer 5 and a collector electrode layer 6 in this order.

The thickness of the light-transmissive electrode layer 2 is consistent with the thickness of a member 8 (see FIG. 2) which will be described later.

The thickness of the electron transport layer 3 is consistent with the thickness of a titanium oxide layer 9 (see FIG. 2) which will be described later.

The thicknesses of the organic semiconductor layer 4, the hole transport layer 5 and the collector electrode layer 6 are suitably set.

A preferable example of the light-transmissive electrode layer 2 is a conductive metal oxide film such as an ITO (Indium Tin Oxide) film. The light-transmissive electrode layer 2 may be disposed on a transparent substrate such as a glass substrate or a resin film.

An example of the electron transport layer 3 is a titanium oxide layer containing titanium oxide ($TiO_2$) that is an n-type semiconductor.

An example of the organic semiconductor layer 4 is a layer containing poly-3-hexylthiophene (P3HT) that is a polythiophene derivative and [6,6]-phenyl-$C_{61}$-butyric acid methyl ester (PCBM) that is a fullerene derivative.

The mass ratio between P3HT and PCBM (P3HT:PCBM) is preferably 5:3 to 5:6 and more preferably 5:3 to 5:4.

The organic semiconductor layer 4 as above may further contain additives such as a conductive material and a dye.

Examples of the conductive material include conductive materials of polyacetylene type, polypyrrole type, polythiophene type, polyparaphenylene type, polyparaphenylene vinylene type, polythienylene vinylene type, poly(3,4-ethylenedioxythiophene) type, polyfluorene type, polyaniline type, and polyacene type (except PEDOT/PSS to be described later).

Examples of the dye include dyes of cyanine type, merocyanine type, phthalocyanine type, naphthalocyanine type, azo type, quinone type, quinoisin type, quinacridone type, squarylium type, triphenylmethane type, xanthene type, porphyrin type, perylene type, and indigo type.

The additive content is preferably 1 to 100 parts by mass and more preferably 1 to 40 parts by mass with respect to 100 parts by mass in total of P3HT and PCBM.

Examples of materials for the hole transport layer 5 include PEDOT/PSS, $V_2O_3$, and $MoO_3$, with PEDOT/PSS being preferred.

PEDOT/PSS is a high molecular compound having PEDOT (poly(3,4-ethylenedioxythiophene)) and PSS (polystyrene sulfonate) combined together, and is sometimes referred to as "PEDOT:PSS."

Examples of the collector electrode layer 6 include an Au electrode layer, an Ag electrode layer, an Al electrode layer, and a Ca electrode layer, and of these, an Au electrode layer is preferred.

[Laminate]

Next, a laminate 7 that serves as the light-transmissive electrode layer 2 and the electron transport layer 3 of the organic thin-film solar cell 1 (see FIG. 1) is described with reference to FIG. 2.

Figure 2:
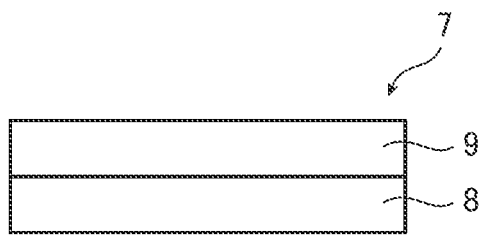
FIG. 2 is a cross-sectional view schematically showing a laminate.

FIG. 2 is a cross-sectional view schematically showing the laminate 7. The laminate 7 includes the member 8 that serves as the light-transmissive electrode layer 2 (see FIG. 1) and the titanium oxide layer 9 that is disposed on the member 8 and serves as the electron transport layer 3 (see FIG. 1).

<Member Serving as Light-Transmissive Electrode Layer>

The member 8 serving as the light-transmissive electrode layer 2 (see FIG. 1) is preferably a member having electrical conductivity and more preferably a member containing indium oxide.

In the case of being a member containing indium oxide, the member 8 is even more preferably a member containing indium tin oxide (ITO) and particularly preferably an ITO film.

The member 8 may be disposed on a transparent substrate such as a glass substrate or a resin film.

The thickness of the member 8 that is for example an ITO film is appropriately set in accordance with the resulting organic thin-film solar cell 1 (see FIG. 1) and is preferably not less than 20 nm, more preferably not less than 80 nm, and even more preferably not less than 150 nm. At the same time, the thickness is preferably not more than 500 nm, more preferably not more than 400 nm, and even more preferably not more than 300 nm.

The thickness of the member 8 is a value determined by forming a cross section of the member 8 with a focused ion beam and measuring the formed cross section with a scanning electron microscope.

<Titanium Oxide Layer>

The titanium oxide layer 9 is a layer containing titanium oxide.

The titanium oxide layer 9 further contains indium oxide and metallic indium, which will be described later.

<<Thickness>>

The titanium oxide layer 9 has a thickness of not less than 1.0 nm. When the thickness of the titanium oxide layer 9 is within the foregoing range, current leakage caused by a defect in the titanium oxide layer 9 hardly occurs, whereby the organic thin-film solar cell 1 using the laminate 7 has excellent output characteristics.

The thickness of the titanium oxide layer 9 is preferably not less than 2.0 nm, more preferably not less than 3.0 nm and even more preferably not less than 4.0 nm because this leads to further excellent output characteristics.

On the other hand, the titanium oxide layer 9 has a thickness of not more than 200.0 nm. When the thickness of the titanium oxide layer 9 is within the foregoing range, an increase in resistance is suppressed, whereby the organic thin-film solar cell 1 has excellent output characteristics. The transparency of the titanium oxide layer 9 is also excellent. Further, the current application time to be described later can be shortened, whereby the productivity of the laminate 7 is also excellent.

The thickness of the titanium oxide layer 9 is preferably not more than 100.0 nm, more preferably not more than 50.0 nm and even more preferably not more than 30.0 nm because this leads to further excellent output characteristics, transparency and productivity.

The thickness of the titanium oxide layer 9 is determined as follows.

First, on a given portion of the titanium oxide layer 9, measurement of narrow-range photoelectron spectra of Ti3s and In3d by means of an X-ray photoelectron spectroscope (XPS device) and sputtering using argon ions ($Ar^+$) are repeatedly carried out under the conditions stated below. By this process, element compositional proportions (unit: at %) in the depth direction of sputtering in the titanium oxide layer 9 are obtained. A relative sensitivity factor method is adopted for determination of the element compositional proportions. As the relative sensitivity factors for the peak areas of narrow-range photoelectron spectra, Ti3s: 0.150 and In3d: 4.530 are used. A distance from the uppermost surface of the titanium oxide layer 9, which is the measurement starting position, to the depth position where the element compositional proportion of titanium (Ti) is $\frac{1}{10}$ of the maximum value is defined as the thickness of the titanium oxide layer 9.

(Conditions of Measurement with XPS Device)
XPS device: Quantera SXM (manufactured by ULVAC-PHI, Inc.)
X-ray source: Monochromatic Al-Kα ray (voltage: 15 kV, output: 25.0 W)
X-ray beam diameter: 100-μm diameter
Measurement range: 100-μm diameter
Pass Energy of narrow-range photoelectron spectrum measurement: 140 eV
Energy Step of narrow-range photoelectron spectrum measurement: 0.125 eV
Sputtering rate: 5.4 nm/min (in terms of $SiO_2$)
$Ar^+$ acceleration energy: 1 keV
Charge neutralization: Electron beam+$Ar^+$
Photoelectron extraction angle: 45° from sample surface normal direction (X-ray incident angle is in sample surface normal direction)

<<Atomic Ratio (InOx/Ti)>>

The titanium oxide layer 9 contains indium oxide. The atomic ratio (InOx/Ti) of the titanium oxide layer 9 is not less than 0.50 and not more than 20.00, where the elemental titanium content is represented by "Ti" and the indium oxide content "InOx."

The titanium oxide layer 9 as above is obtained by a method to be described later, and in this case, presumably, many $In^{3+}$'s are present and much oxygen deficiency is introduced as compared with a titanium oxide layer formed using a conventional sol-gel process (for example, see Patent Literature 1). Excess electrons are generated due to the oxygen deficiency, and a part of the electrons contributes to electrical conductivity as carriers.

Thus, the organic thin-film solar cell 1 using the laminate 7 having the titanium oxide layer 9 has excellent output characteristics.

However, any other mechanisms than the foregoing are also regarded as being within the scope of the invention.

The atomic ratio (InOx/Ti) is preferably not less than 5.00, more preferably not less than 8.00, further preferably more than 10.00 and particularly preferably not less than 11.00 because this leads to more excellent output characteristics.

For the upper limit value, the atomic ratio (InOx/Ti) is preferably not more than 18.00, more preferably not more than 16.00, and further preferably not more than 14.00.

<<Atomic Ratio (InM/Ti)>>

The titanium oxide layer 9 further contains metallic indium.

The atomic ratio (InM/Ti) is less than 0.100, where the elemental titanium content is represented by "Ti" and the metallic indium content "InM." With this constitution, the transparency of the titanium oxide layer 9 (electron transport layer 3) is excellent.

The atomic ratio (InM/Ti) is preferably not more than 0.050, more preferably not more than 0.030, and further preferably not more than 0.010 because this leads to more excellent transparency.

For the lower limit value, the atomic ratio (InM/Ti) is preferably not less than 0.001.

The atomic ratios (InOx/Ti) and (InM/Ti) are determined as follows.

First, the measurement using an XPS device is carried out on the titanium oxide layer 9 in the same manner as described above. Next, the obtained narrow-range photoelectron spectrum of In3d is subjected to peak separation to be divided into a metal component and an oxide component. More precisely, in the peak separation, function fitting is carried out using software, i.e., MultiPak (Ver. 8.2C).

To oxides, a Gaussian-Lorentzian function is applied. To metal components, an asymmetric function (tail length: 14.85±3.00, tail scale: 0.23±0.10) is applied.

Note that indium oxide and metallic indium have peak positions close to each other. To cope with it, having the following ranges, and with the peak heights, the half-widths and the Gaussian function ratios being used as variable parameters, convergence calculation is carried out such that a residual sum of squares with respect to the actually measured spectrum becomes minimum.

Indium oxide: 444.6±0.5 eV
Metallic indium: 443.8±0.5 eV

Element compositional proportions (unit: at %) of titanium (Ti), indium oxide and metallic indium are integrated over a portion from the uppermost surface of the titanium oxide layer 9 to the depth position where the element compositional proportion of titanium (Ti) is $\frac{1}{10}$ of the maximum value, thereby obtaining their integration values.

Each of the integration value of indium oxide (InOx) and the integration value of metallic indium (InM) is divided by the integration value of titanium (Ti). In this manner, the atomic ratios (InOx/Ti) and (InM/Ti) are obtained.

[Laminate Producing Method]

In order to produce the above-mentioned laminate 7, the member 8 is subjected to cathode polarization and then to anode polarization in a treatment solution containing a Ti component. For the counter electrode, an insoluble electrode such as a platinum electrode is suitable. The cathode polarization and the anode polarization of the member 8 are performed in, for example, an electrolytic treatment tank.

More particularly, first, current is applied with the member 8, such as an ITO film, being used as the cathode. Consequently, the titanium oxide layer 9 is formed on the member 8. It is presumed that through this cathode polarization, metallic indium is deposited inside the titanium oxide layer 9 and at the interface between the titanium oxide layer 9 and the member 8 such as an ITO film.

It is presumed that the titanium oxide layer 9 is formed as follows. First, upon generation of hydrogen, the pH increases at the surface of the member 8. As a result, when the Ti component in the treatment solution is hexafluorotitanic acid and/or its salt for instance, hexafluorotitanic acid ions in the treatment solution generate titanium hydroxide while being defluorinated. It is likely that this titanium hydroxide adheres to the surface of the member 8, and through subsequent washing and dehydration condensation by drying or the like, the titanium oxide layer 9 is formed. However, any other mechanisms than the foregoing are also regarded as being within the scope of the invention.

Current is then applied using the member 8 as the anode. In this manner, metallic indium deposited in the titanium oxide layer 9 is oxidized to improve the transparency.

As described above, the member 8 is preferably a member having electrical conductivity, e.g., a conductive metal oxide film such as an ITO film.

The member 8 may be disposed on a transparent substrate such as a glass substrate or a resin film, as described above. In this case, the transparent substrate having the member 8 (e.g., an ITO film-bearing glass substrate) is subjected to cathode polarization and then to anode polarization. In this case, the resulting laminate also includes this transparent substrate.

The treatment solution contains a Ti component (Ti compound) for supplying Ti (elemental titanium) to the titanium oxide layer 9 to be formed.

As the Ti component, preferred is at least one selected from the group consisting of hexafluorotitanic acid ($H_2TiF_6$), potassium hexafluorotitanate ($K_2TiF_6$), sodium hexafluorotitanate ($Na_2TiF_6$), ammonium hexafluorotitanate (($NH_4)_2TiF_6$), ammonium titanyl oxalate (($NH_4)_2[TiO(C_2O_4)_2]$), potassium titanyl oxalate dihydrate ($K_2[TiO(C_2O_4)_2]\cdot 2H_2O$), titanium sulfate ($Ti(SO_4)_2$), and titanium lactate ($Ti(OH)_2[OCH(CH_3)COOH]_2$).

Of these, hexafluorotitanic acid and/or its salts (potassium hexafluorotitanate, sodium hexafluorotitanate, ammonium hexafluorotitanate) are preferred for the sake of stability of the treatment solution, availability, and other factors.

The Ti content of the treatment solution is preferably not less than 0.004 mol/L, more preferably not less than 0.010 mol/L, and even more preferably not less than 0.020 mol/L.

At the same time, the Ti content of the treatment solution is preferably not more than 1.300 mol/L, more preferably not more than 1.000 mol/L, even more preferably not more than 0.700 mol/L, particularly preferably not more than 0.300 mol/L, and most preferably not more than 0.150 mol/L.

Water is used as a solvent of the treatment solution.

The pH of the treatment solution is not particularly limited and is for example 2.0 to 5.0. Known acid components (e.g., phosphoric acid, sulfuric acid) or alkaline components (e.g., sodium hydroxide, ammonia water) may be used for pH adjustment.

The treatment solution may optionally contain a surfactant such as sodium lauryl sulfate or acetylenic glycol. The treatment solution may also contain condensed phosphate such as pyrophosphate for the sake of stability of deposition behavior over time.

The treatment solution has a temperature preferably of 20° C. to 80° C. and more preferably of 40° C. to 60° C.

The treatment solution may further contain a conduction aid.

Exemplary conduction aids include: sulfates such as potassium sulfate, sodium sulfate, magnesium sulfate and calcium sulfate; nitrates such as potassium nitrate, sodium nitrate, magnesium nitrate and calcium nitrate; and chloride salts such as potassium chloride, sodium chloride, magnesium chloride and calcium chloride.

The conduction aid content of the treatment solution is preferably 0.010 to 1.000 mol/L and more preferably 0.020 to 0.500 mol/L.

The current density during cathode polarization is preferably not less than 0.01 $A/dm^2$, more preferably not less than 0.10 $A/dm^2$, and even more preferably not less than 0.20 $A/dm^2$.

At the same time, the current density during cathode polarization is preferably not more than 5.00 $A/dm^2$, more preferably not more than 4.00 $A/dm^2$, and even more preferably not more than 3.00 $A/dm^2$.

The current application time is suitably set to obtain a desired thickness of the titanium oxide layer 9.

The current density during anode polarization is preferably not less than 0.01 $A/dm^2$, more preferably not less than 0.10 $A/dm^2$, and even more preferably not less than 0.20 $A/dm^2$.

At the same time, the current density during anode polarization is preferably not more than 5.00 $A/dm^2$, more preferably not more than 4.00 $A/dm^2$, and even more preferably not more than 3.00 $A/dm^2$.

The current application time is suitably specified to oxidize the metallic indium ($In \rightarrow In^{3+}$) deposited, for example, inside the titanium oxide layer 9.

Cathode polarization and/or anode polarization may be followed by washing with water.

The water washing method is not particularly limited, and one exemplary method is immersion in water after cathode polarization and/or anode polarization. Washing with water is performed in, for example, a water washing tank to be described later. The temperature of water (water temperature) for use in washing is preferably 40° C. to 90° C.

The washing time is preferably more than 0.5 seconds and preferably 1.0 to 5.0 seconds.

Further, drying may replace or follow the washing with water. The temperature and the method of drying are not particularly limited, and a drying process using a typical drier or electric furnace may be employed for example. The drying temperature is preferably not higher than 100° C.

As a method of producing the laminate 7, a batch type or a continuous type is preferable.

This method is appropriately selected according to, for example, a type or a shape of a transparent substrate (glass substrate or a resin film) on which the member 8 is disposed.

For example, when the member 8 is disposed on a glass substrate (that is, when a glass substrate with the member 8 is used), the batch type production is preferable.

In this case, for example, a washing treatment tank, an electrolytic treatment tank, and a water washing tank may be prepared, and the glass substrate with the member 8 may be immersed and treated in each tank.

The cathode polarization and the anode polarization may be carried out in one electrolytic treatment tank or in two separate electrolytic treatment tanks.

In addition, for example, when the member 8 is disposed on a resin film wound in a roll form (that is, when a resin film with the member 8 is used), the continuous type production is preferred for the sake of productivity.

In this case, for example, a washing treatment tank, an electrolytic treatment tank, a water washing tank, and a drying device are disposed between a tension reel for unwinding and a tension reel for winding, and rolls are appropriately provided so that the resin film with the member 8 is continuously passed through the respective tanks.

The cathode polarization and the anode polarization may be carried out in one electrolytic treatment tank or in two separate electrolytic treatment tanks. In the latter case, a water washing tank may be further provided between the two electrolytic treatment tanks.

[Method for Producing Organic Thin-Film Solar Cell]

The organic thin-film solar cell 1 including the light-transmissive electrode layer 2, the electron transport layer 3, the organic semiconductor layer 4, the hole transport layer 5 and the collector electrode layer 6 in this order is produced using the above-described laminate 7.

For instance, layers serving as the organic semiconductor layer 4, the hole transport layer 5 and the collector electrode layer 6 are sequentially formed on the titanium oxide layer 9 in the laminate 7.

The organic semiconductor layer 4 is formed by, for example, spin-coating a solution having P3HT and PCBM dissolved therein onto the titanium oxide layer 9 serving as the electron transport layer 3, followed by drying. Examples of a solvent of the solution include 2,6-dichlorotoluene, chloroform, chlorobenzene, and a mixture of two or more thereof.

The hole transport layer 5 is formed by, for example, spin-coating an aqueous dispersion of PEDOT/PSS onto the organic semiconductor layer 4, followed by drying.

The collector electrode layer 6 is formed by, for example, vapor-depositing metal such as Au onto the hole transport layer 5.

The methods for forming the respective layers are not limited to the foregoing methods, and known methods may be suitably used.

EXAMPLES

The invention is specifically described below with reference to Examples. However, the present invention should not be construed as being limited to the following examples.

<Preparation of Member Serving as Light-Transmissive Electrode Layer>

Prepared was an ITO film-bearing glass substrate (sheet resistance: 10 Ω/sq, manufactured by Ideal Star Inc.) having an ITO (Indium Tin Oxide) film laminated on one surface of a glass substrate (30 mm×35 mm, thickness: 0.7 mm, alkali-free glass) by sputtering. The thickness of the ITO film was 150 nm. This ITO film-bearing glass substrate was used as a transparent substrate having a member serving as the light-transmissive electrode layer.

<Production of Laminate Serving as Light-Transmissive Electrode Layer and Electron Transport Layer>

A laminate serving as the light-transmissive electrode layer and the electron transport layer was produced using the prepared ITO film-bearing glass substrate (the transparent substrate having the member serving as the light-transmissive electrode layer) in the following manner.

First, prepared was a treatment solution containing 0.040 mol/L of potassium hexafluorotitanate ($K_2TiF_6$) and 0.10 mol/L of potassium sulfate ($K_2SO_4$) and having the pH adjusted to 4.0 by use of potassium hydroxide (hereinafter simply called "treatment solution").

Next, the prepared ITO film-bearing glass substrate was immersed in a cleaning solution having Semiclean M-4 (manufactured by Yokohama Oils & Fats Industry Co., Ltd.) diluted by 20 times with ion exchanged water, and subjected to ultrasonic cleaning for 10 minutes. Thereafter, the ITO film-bearing glass substrate was taken out from the cleaning solution, immersed in ion exchanged water, and subjected to ultrasonic cleaning for 10 minutes.

The cleaned ITO film-bearing glass substrate was immersed in the prepared treatment solution (solution temperature: 50° C.). The ITO film-bearing glass substrate was subjected to cathode polarization and then to anode polarization in the treatment solution under the relevant conditions shown in Table 1 below. Then, the ITO film-bearing glass substrate was immersed in a water bath at 25° C. for 2.0 seconds for washing with water, followed by drying by a blower at room temperature. Thus, a titanium oxide layer serving as the electron transport layer was formed on the ITO film of the ITO film-bearing glass substrate. The ITO film-bearing glass substrate having the titanium oxide layer formed thereon (a laminate serving as the light-transmissive electrode layer and the electron transport layer) was produced in this manner.

<Production of Comparative Laminate>

First, 6.25 mmol of titanium tetraisopropoxide was added to 12.5 mL of 2-methoxyethanol, and the mixture was cooled in an ice bath for 10 minutes. Subsequently, 12.5 mmol of acetylacetone was added thereto, and the mixture was stirred in an ice bath for 10 minutes to thereby obtain a mixed solution. The obtained mixed solution was heated at 80° C. for 2 hours and then refluxed for 1 hour. Finally, the mixed solution was cooled to room temperature, thereby obtaining a titanium oxide precursor solution. The atmosphere in each step was a nitrogen atmosphere.

Next, the titanium oxide precursor solution was spin-coated on the ITO film of the ITO film-bearing glass substrate, which had been cleaned, under the conditions of a rotational speed of 2000 rpm and a rotational time of 60 seconds to form a coating. Thereafter, the resultant was left in air to hydrolyze a titanium oxide precursor in the coating. Then, heating treatment at 150° C. for 1 hour was carried out to obtain a titanium oxide layer with a thickness of 30.0 nm.

A laminate (comparative laminate) thus produced was used for No. 9 to be described later.

<Thickness of Titanium Oxide Layer and Atomic Ratio>

The thickness of the titanium oxide layer, and the atomic ratio (InOx/Ti) and the atomic ratio (InM/Ti) were obtained in the above-described manners. The results are shown in Table 1 below.

<Visible Light Transmittance of Laminate>

The visible light transmittance (unit: %) of the produced laminate was measured under the following conditions. The results are shown in Table 1 below. With a larger visible light transmittance value, the transparency can be rated as more excellent.

Measurement device: Spectrophotometer SD7000 (manufactured by NIPPON DENSHOKU INDUSTRIES Co., Ltd.)

Measurement range: 5-mm diameter

Measurement wavelength: 600 nm

<Production of Organic Thin-Film Solar Cell>

In the following manner, an organic thin-film solar cell having a photoelectric conversion area of 4 mm×25 mm, that is, 1.0 $cm^2$ was produced using the produced laminate.

<<Formation of Organic Semiconductor Layer>>

A mixed solution was obtained by mixing 2,6-dichlorotoluene and chloroform at a volume ratio of 1:1. Into this mixed solution, P3HT (manufactured by Aldrich) and PCBM (manufactured by Frontier Carbon Corporation) were dissolved at a mass ratio of 5:4 such that the total concentration was 3.9 mass %.

The thus-obtained mixed solution was spin-coated onto the titanium oxide layer under the conditions of 1500 rpm and 60 seconds and dried at room temperature for about 10 minutes, thereby obtaining an organic semiconductor layer with a thickness of 250 nm.

<<Formation of Hole Transport Layer>>

Prepared was a nonionic surfactant (manufactured by Aldrich) containing 1 mass % of polyoxyethylene tridecyl ether ($C_{13}H_{27}$ $(OCH_2CH_2)_6OH$) and 1 mass % of xylene and having water and isopropanol as solvents. This nonionic surfactant in an amount of 0.5 parts by mass was mixed to 100 parts by mass of 1.3 mass % aqueous PEDOT/PSS dispersion (manufactured by Aldrich) to obtain a PTE-containing aqueous PEDOT/PSS dispersion.

The PTE-containing aqueous PEDOT/PSS dispersion was heated to 50° C. to 90° C., spin-coated onto the organic semiconductor layer under the conditions of 6000 rpm and 60 seconds, and then naturally dried at room temperature, thereby forming a hole transport layer with a thickness of 80 nm.

<<Formation of Collector Electrode Layer>>

An Au electrode layer (collector electrode layer) was formed on the hole transport layer by vacuum deposition to have a thickness of about 100 nm.

More specifically, a shadow mask corresponding to an electrode shape of 4 mm×25 mm and the glass substrate on which the layers up to the hole transport layer had been formed were placed in a chamber. The pressure in the chamber was reduced using a rotary pump and a turbomolecular pump to achieve a pressure of not higher than $2\times10^{-3}$ Pa in the chamber. A gold wire was subjected to resistance heating in the chamber to form, via the shadow mask, a film of gold with a thickness of 100 nm on the hole transport layer. The film formation rate was set to 10 to 15 nm/min, and the pressure during the film formation was not higher than $1\times10^{-2}$ Pa.

The thus-obtained glass substrate on whose one surface the ITO film (light-transmissive electrode layer), the titanium oxide layer (electron transport layer), the organic semiconductor layer, the hole transport layer and the collector electrode layer had been formed was heated at 150° C. for 5 minutes and further held at 70° C. for 1 hour. Thereafter, atmospheric sealing was made. Thus, an organic thin-film solar cell was produced.

<Evaluation on Organic Thin-Film Solar Cell (Output Characteristics)>

The following evaluation was conducted with the produced organic thin-film solar cell.

The organic thin-film solar cell was irradiated, from its ITO film side, with artificial sunlight having a spectrum distribution of AM 1.5G (IEC standard 60904-3) and a light intensity of 100 mW/cm² by use of a solar simulator (XES-502S, manufactured by SAN-EI Electric Co., Ltd.). In this state, a photocurrent-voltage profile of the organic thin-film solar cell was measured with a linear sweep voltammetry (LSV) measurement device (HZ-5000, manufactured by Hokuto Denko Corporation). The maximum output was determined based on the obtained profile and evaluated according to the following criteria. The results are shown in Table 1 below. With a larger maximum output value, the output characteristics can be rated as more excellent.

A: Maximum output of not less than 2.40 mW/cm²
B: Maximum output of not less than 1.70 mW/cm² and less than 2.40 mW/cm²
C: Maximum output of less than 1.70 mW/cm²

[Table 1]

TABLE 1

| No. | Member serving as light-transmissive electrode layer | Cathode polarization condition Current density [A/dm²] | Cathode polarization condition Electrolytic time [s] | Anode polarization condition Current density [A/dm²] | Anode polarization condition Electrolytic time [s] | Titanium oxide layer Thickness [nm] | Titanium oxide layer InOx/Ti | Titanium oxide layer InM/Ti | Visible light transmittance [%] | Output Characteristics | Remarks |
|---|---|---|---|---|---|---|---|---|---|---|---|
| 1 | ITO film | 0.50 | 13 | 0.50 | 10 | 4.0 | 11.50 | 0.001 | 88.5 | A | Inventive example |
| 2 | ITO film | 0.50 | 20 | 0.50 | 10 | 17.0 | 8.50 | 0.001 | 87.0 | B | Inventive example |
| 3 | ITO film | 0.50 | 23 | 0.50 | 15 | 26.7 | 5.20 | 0.001 | 85.0 | B | Inventive example |
| 4 | ITO film | 0.50 | 23 | 0.10 | 100 | 21.8 | 7.10 | 0.001 | 86.0 | B | Inventive example |
| 5 | ITO film | 0.50 | 23 | 1.00 | 10 | 16.8 | 8.40 | 0.001 | 87.0 | B | Inventive example |
| 6 | ITO film | 5.00 | 0.4 | 0.50 | 3 | 4.0 | 11.20 | 0.001 | 88.0 | A | Inventive example |
| 7 | ITO film | 0.50 | 120 | 0.50 | 80 | 200.0 | 0.50 | 0.001 | 82.0 | B | Inventive example |
| 8 | ITO film | 0.50 | 16 | — | — | 30.0 | 3.50 | 0.180 | 62.3 | B | Comparative example |
| 9 | ITO film | — | — | — | — | 30.0 | 0.40 | 0.000 | 85.0 | C | Comparative example |

<Summary of Evaluation Results>

As shown in Table 1 above, No. 1 to No. 7 having atomic ratios (InOx/Ti) of not less than 0.50 and not more than 20.00 had better output characteristics than those of No. 9 that did not satisfy this range.

Comparing among No. 1 to No. 7, No. 1 and No. 6 having larger values of atomic ratios (InOx/Ti) had more excellent output characteristics than those of No. 2 to No. 5 and No. 7.

In addition, No. 1 to No. 7 having atomic ratios (InM/Ti) of less than 0.100 had higher visible-light transmittance values and better transparencies than those of No. 8 that did not satisfy this range.

Therefore, both the output characteristics and the transparencies in No. 1 to No. 7 were good.

REFERENCE SIGNS LIST 1 organic thin-film solar cell
2 light-transmissive electrode layer
3 electron transport layer
4 organic semiconductor layer
5 hole transport layer
6 collector electrode layer
7 laminate
8 member serving as light-transmissive electrode layer
9 titanium oxide layer

The invention claimed is:

1. A laminate serving as a light-transmissive electrode layer and an electron transport layer of an organic thin-film solar cell including the light-transmissive electrode layer, the electron transport layer, an organic semiconductor layer, a hole transport layer and a collector electrode layer in this order, the laminate comprising:
   a member that serves as the light-transmissive electrode layer; and
   a titanium oxide layer that is disposed on the member serving as the light-transmissive electrode layer and serves as the electron transport layer,
   wherein the titanium oxide layer has a thickness of not less than 1.0 nm and not more than 200.0 nm, and
   wherein the titanium oxide layer contains indium oxide and metallic indium, InOx/Ti is not less than 0.50 and not more than 20.00 in atomic ratio, and InM/Ti is less than 0.100 in atomic ratio, where an elemental titanium content is represented by Ti, an indium oxide content is represented by InOx, and a metallic indium content is represented by InM.

2. An organic thin-film solar cell including a light-transmissive electrode layer, an electron transport layer, an organic semiconductor layer, a hole transport layer and a collector electrode layer in this order and using the laminate according to claim 1.

3. A laminate producing method for producing the laminate according to claim 1, the method comprising:
   subjecting the member that serves as the light-transmissive electrode layer to cathode polarization and then to anode polarization in a treatment solution containing a Ti component to thereby form the titanium oxide layer on the member that serves as the light-transmissive electrode layer.

4. The laminate producing method according to claim 3, wherein a Ti content of the treatment solution is not less than 0.004 mol/L and not more than 1.300 mol/L.

5. The laminate producing method according to claim 3, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

6. The laminate producing method according to claim 4, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

7. The laminate producing method according to claim 3, wherein current is applied at a current density of not less than 0.01 $A/dm^2$ and not more than 5.00 $A/dm^2$ with the member that serves as the light-transmissive electrode layer being used as a cathode, and then current is applied at a current density of not less than 0.01 $A/dm^2$ and not more than 5.00 $A/dm^2$ with the member that serves as the light-transmissive electrode layer being used as an anode.

8. The laminate producing method according to claim 4, wherein current is applied at a current density of not less than 0.01 $A/dm^2$ and not more than 5.00 $A/dm^2$ with the member that serves as the light-transmissive electrode layer being used as a cathode, and then current is applied at a current density of not less than 0.01 $A/dm^2$ and not more than 5.00 $A/dm^2$ with the member that serves as the light-transmissive electrode layer being used as an anode.

9. The laminate producing method according to claim 5, wherein current is applied at a current density of not less than 0.01 $A/dm^2$ and not more than 5.00 $A/dm^2$ with the member that serves as the light-transmissive electrode layer being used as a cathode, and then current is applied at a current density of not less than 0.01 $A/dm^2$ and not more than 5.00 $A/dm^2$ with the member that serves as the light-transmissive electrode layer being used as an anode.

10. The laminate producing method according to claim 6, wherein current is applied at a current density of not less than 0.01 $A/dm^2$ and not more than 5.00 $A/dm^2$ with the member that serves as the light-transmissive electrode layer being used as a cathode, and then current is applied at a current density of not less than 0.01 $A/dm^2$ and not more than 5.00 $A/dm^2$ with the member that serves as the light-transmissive electrode layer being used as an anode.

11. An organic thin-film solar cell producing method for producing an organic thin-film solar cell including a light-transmissive electrode layer, an electron transport layer, an organic semiconductor layer, a hole transport layer and a collector electrode layer in this order by using the laminate according to claim 1.

* * * * *